(12) United States Patent
Hikata

(10) Patent No.: US 7,785,558 B2
(45) Date of Patent: Aug. 31, 2010

(54) METHOD OF MANUFACTURING CARBON NANOSTRUCTURE

(75) Inventor: Takeshi Hikata, Osaka (JP)

(73) Assignee: Sumitomo Electric Industries, Ltd., Osaka (JP)

( * ) Notice: Subject to any disclaimer, the term of this patent is extended or adjusted under 35 U.S.C. 154(b) by 296 days.

(21) Appl. No.: 11/587,212

(22) PCT Filed: Jan. 28, 2005

(86) PCT No.: PCT/JP2005/001259

§ 371 (c)(1),
(2), (4) Date: Oct. 23, 2006

(87) PCT Pub. No.: WO2005/102923

PCT Pub. Date: Nov. 3, 2005

(65) Prior Publication Data

US 2007/0224107 A1    Sep. 27, 2007

(30) Foreign Application Priority Data

| Apr. 23, 2004 | (JP) | ............................. 2004-128231 |
| Jul. 28, 2004 | (JP) | ............................. 2004-220432 |

(51) Int. Cl.
*D01F 9/12* (2006.01)
*D01F 9/127* (2006.01)
*C09C 1/56* (2006.01)
*C23C 16/00* (2006.01)

(52) U.S. Cl. ................. 423/447.3; 423/447.5; 423/460; 427/249.1; 977/742

(58) Field of Classification Search .... 423/447.1–447.8
See application file for complete search history.

(56) References Cited

U.S. PATENT DOCUMENTS 4,572,813 A    2/1986   Arakawa

| 6,350,488 | B1 | 2/2002 | Lee et al. | |
| 6,673,392 | B2* | 1/2004 | Lee et al. | ................. 427/249.1 |
| 6,887,451 | B2* | 5/2005 | Dodelet et al. | ........... 423/447.3 |
| 2001/0009693 | A1 | 7/2001 | Lee et al. | |

(Continued)

FOREIGN PATENT DOCUMENTS

| CN | 1315588 A | 10/2001 |
| JP | 60-054998 A | 3/1985 |
| JP | 2001-020071 A | 1/2001 |

(Continued)

OTHER PUBLICATIONS

D. Fujita, Discovery of Carbon Nanowires Formed on a Carbon-Doped Ni(111) Substrate by a Bulk-to-Surface Precipitation Process, Jpn. J. Appl. Phys., 2003, vol. 42, pp. 1391 to 1394.

Chinese Office Action, w/ English translation thereof, issued in Chinese Patent Application No. CN 200580012691.6 dated Feb. 20, 2009.

*Primary Examiner*—Jerry Lorengo
*Assistant Examiner*—Joseph V Micali
(74) *Attorney, Agent, or Firm*—McDermott Will & Emery LLP

(57) ABSTRACT

The present invention relates to a method of manufacturing a carbon nanostructure for growing crystalline carbon by vapor deposition from a crystal growth surface of a catalytic base including a catalytic material, and in particular, to a method of manufacturing a carbon nanostructure where at least two gases including a feedstock gas are brought into contact with the catalytic base simultaneously. Preferably, the at least two gases are constituted by at least one feedstock gas and at least one carrier gas. Preferably, the carrier gas is brought into contact with the crystal growth surface, and the feedstock gas is brought into contact with at least a part of a region except for the crystal growth surface with which the carrier gas has been brought into contact. Preferably, the material gas contains an ion, and further preferably, it contains a carbon ion.

21 Claims, 5 Drawing Sheets

U.S. PATENT DOCUMENTS

| | | | |
|---|---|---|---|
| 2002/0159943 A1* | 10/2002 | Smalley et al. | 423/447.1 |
| 2002/0172767 A1* | 11/2002 | Grigorian et al. | 427/255.28 |
| 2003/0161782 A1* | 8/2003 | Kim | 423/447.3 |
| 2003/0181328 A1* | 9/2003 | Hwang et al. | 502/325 |
| 2004/0045808 A1* | 3/2004 | Fabry et al. | 204/173 |
| 2005/0170089 A1* | 8/2005 | Lashmore et al. | 427/248.1 |
| 2005/0238810 A1* | 10/2005 | Scaringe et al. | 427/249.1 |
| 2005/0276743 A1* | 12/2005 | Lacombe et al. | 423/447.3 |

FOREIGN PATENT DOCUMENTS

| | | |
|---|---|---|
| JP | 2002-255519 A | 9/2002 |
| JP | 2003-508188 A | 3/2003 |
| JP | 2003-292315 A | 10/2003 |
| JP | 2004-123446 A | 4/2004 |
| WO | WO 01/16024 A1 | 3/2001 |

* cited by examiner (A)    (B)

(A)  (B)

METHOD OF MANUFACTURING CARBON NANOSTRUCTURE

RELATED APPLICATIONS

This application is the U.S. National Phase under 35 U.S.C. §371 of International Application No. PCT/JP2005/001259 filed on Jan. 28, 2005, which in turn claims the benefit of JP 2004-128231 and JP 2004-220432 filed on Apr. 23, 2004 and Jul. 28, 2004 respectively.

TECHNICAL FIELD

The present invention relates to a method of manufacturing carbon nanostructures that allows carbon nanostructures having a uniform shape to be produced in high purity and in a stable manner.

BACKGROUND ART

In recent years, a carbon nanostructure, which is represented by a carbon nanotube or the like and which is formed by carbon atoms being aligned in a diameter of nanometer level, is receiving widespread attention as a carbon-base high performance material having excellent conductivity, mechanical strength and the like. As a method of producing the carbon nanotube, a pyrolysis method has been devised, where a feedstock gas such as an alcohol base gas, a hydrocarbon base gas or the like undergoes pyrolysis in a heating furnace using catalyst particles having a diameter of nanometer level, in order to grow crystalline carbon on the catalyst particles to be carbon nanotubes. The pyrolysis method includes a method where catalyst particles are carried on a base by application or the like, a method where catalysts are suspended in a vapor phase and the like.

For example, Japanese Patent Laying-Open No. 60-54998 (Patent Document 1) proposes heating a mixture of a gaseous organic transition metal compound, a carrier gas and a gaseous organic compound to 800-1300° C. for producing a vapor deposition carbon fiber in suspension.

Japanese Patent Laying-Open No. 2001-20071 (Patent Document 2) proposes a method for synthesizing a carbon nanotube including the steps of: forming a catalytic metal film on a substrate; etching the catalytic metal film to form separated catalytic metal nanoparticles; and supplying a carbon source gas into a thermochemical vapor deposition system to grow a carbon nanotube on each of the separated catalyst metal nanoparticles by thermochemical vapor deposition, thereby forming on the substrate a plurality of aligned carbon nanotubes perpendicular to the substrate, where the step of forming separated catalytic metal nanoparticles is performed by gas etching, where an etching gas, which is one selected from the group consisting of ammonia gas, hydrogen gas and hydride gas, undergoes pyrolysis to be used.

Japanese Patent Laying-Open No. 2002-255519 (Patent Document 3) proposes a method of vapor-phase synthesizing a single-layer carbon nanotube by directing a hydrocarbon gas together with a carrier gas onto a base including a thermoresistant porous body carrying dispersed catalytic microparticles and utilizing pyrolysis of the hydrocarbon gas.

Japanese Patent Laying-Open No. 2003-292315 (Patent Document 4) proposes a method of manufacturing a carbon nanotube on a metal surface using chemical vapor deposition by heating the metal and flowing toward it a gas which serves as a carbon source, characterized in that the metal surface has fine asperities provided by growing in advance oxide microparticles on the metal surface.

Unfortunately, conventional methods such as those in Patent Documents 1 to 4 produced carbon-containing by-products such as amorphous carbon or graphite in addition to desired carbon nanotubes. They also produced carbon nanotubes with large variation in their diameter, making it difficult to manufacture uniform carbon nanotubes in a stable manner.

It is assumed that the variation among the carbon nanotubes in their shape is caused by variation of the catalyst particles in their morphology. Since it is difficult to control the shape of the catalyst particles when they are formed by means of a chemical method such as the pyrolysis method, variation in their morphology is caused. Aggregation of catalyst particles may also cause a morphological variation.

Further, varying growth rate of crystalline carbon on catalyst particles as well as simultaneous occurrence of dissolution and precipitation of the carbon grown by pyrolysis of a feedstock gas on the same surface also tend to cause the variation among the resulting carbon nanotubes in their shape.

Patent Document 1: Japanese Patent Laying-Open No. 60-54998
Patent Document 2: Japanese Patent Laying-Open No. 2001-20071
Patent Document 3: Japanese Patent Laying-Open No. 2002-255519
Patent Document 4: Japanese Patent Laying-Open No. 2003-292315

DISCLOSURE OF THE INVENTION

Problems to be Solved by the Invention

An object of the present invention is to solve the aforementioned problems, and to provide a method of manufacturing carbon nanostructures that allows carbon nanostructures having a more uniform shape to be produced in high purity and in a stable manner.

Means for Solving the Problems

The present invention relates to a method of manufacturing a carbon nanostructure for growing crystalline carbon by means of vapor deposition from a crystal growth surface of a catalytic base including at least a catalytic material. At least two conditions for bringing an ambient gas into contact with the catalytic base are set simultaneously, and the ambient gas is one gas or at least two gases including at least one feedstock gas.

It is noted that "a carbon nanostructure" as in the present invention refers to a microstructure of nanometer level, constituted by crystalline carbon of, for example, tubular, spiral, horn, and spherical shape.

Preferably, the ambient gas is constituted by at least one feedstock gas and at least one carrier gas.

Preferably, the carrier gas is brought into contact with the crystal growth surface out of a surface of the catalytic base, and the feedstock gas is brought into contact with at least a part of a region except for the crystal growth surface with which the carrier gas has been brought into contact.

In the present invention, preferably, the ambient gas is supplied so that carbon is continuously supplied to the resulting crystalline carbon.

In the present invention, preferably, the at least two conditions for bringing into contact are simultaneously set by setting the ambient gas to be brought into contact with the catalytic base with at least two different pressures.

In special, preferably, at least one gas in the one or at least two ambient gas(es) is supplied so as to be brought into contact with the catalytic base with a pressure of at least atmospheric pressure.

In the present invention, preferably, an area of the catalytic material in contact with the feedstock gas is set to be greater than a surface area of the crystal growth surface of the catalytic material.

In the present invention, preferably, a carrier gas is supplied so as to be converged at least at one portion after passing near the crystal growth surface.

Preferably, a carrier gas is supplied so as to form a vortex after passing near the crystal growth surface.

In the present invention, preferably, a heat source is provided for changing a temperature near the crystal growth surface. It is also preferable that a temperature stabilizing apparatus for attaining a constant temperature of a portion of the catalytic base in contact with the feedstock gas.

In producing the catalytic base, preferably, mechanical polishing and/or sputtering is provided to the crystal growth surface.

In the present invention, preferably, a reactivation process is provided to the crystal growth surface employing at least one selected from the group consisting of chemical polishing, physical polishing, and sputtering.

Preferably, the catalytic base used in the present invention is constituted by the catalytic material with a catalytic action to growth of crystalline carbon and a non-catalytic material without a substantial catalytic action.

Preferably, when the catalytic base used in the present invention is constituted by a catalytic material and a non-catalytic material, the catalytic material is exposed only in a portion of the crystal growth surface in contact with the feedstock gas, while the non-catalytic material is exposed in the other portion of the catalytic base.

Preferably, when the catalytic base used in the present invention is constituted by a catalytic material and a non-catalytic material, the catalytic material and the non-catalytic material do not substantially form an alloy or a compound.

Preferably, when the catalytic base used in the present invention is constituted by a catalytic material and a non-catalytic material, as the non-catalytic material, the non-catalytic material includes at least one selected from the group consisting of Ag, Au, Ru, Rh, Pd, Os, Ir, and Pt. A combination where the catalytic material is at least one selected from the group consisting of Fe, Co, Mo, Ni, In, and Sn, and the non-catalytic material is Ag and/or Ag containing alloy is also preferable.

Preferably, in the present invention, a reinforce material for suppressing deformation of the catalytic base is formed to at least a part of the catalytic base.

Further, preferably, the material of catalytic base is selected so as to suppress precipitation of carbon inside the catalytic base.

Preferably, in the present invention, at least one of selection of a gas, a gas pressure and a temperature is controlled so as to suppress precipitation of carbon inside the catalytic material of the catalytic base and/or at an interface between the catalytic material and a non-catalytic material.

Preferably, in the present invention, the ambient gas contains an ion. Further, preferably, the ion includes a carbon ion, and the carbon ion is collided to the catalytic material by an electric field. In this case, a method where a voltage is applied to the catalytic base and the carbon ion is collided to the catalytic material by a potential difference may preferably be employed.

Effects of the Invention

According to the present invention, by causing dissolution of carbon produced by pyrolysis of a feedstock gas and precipitation of crystalline carbon at different specific portions on a catalytic base, carbon nanostructures such as carbon nanotubes are allowed to be manufactured in a uniform shape, in high purity and in a stable manner.

Figure 1:
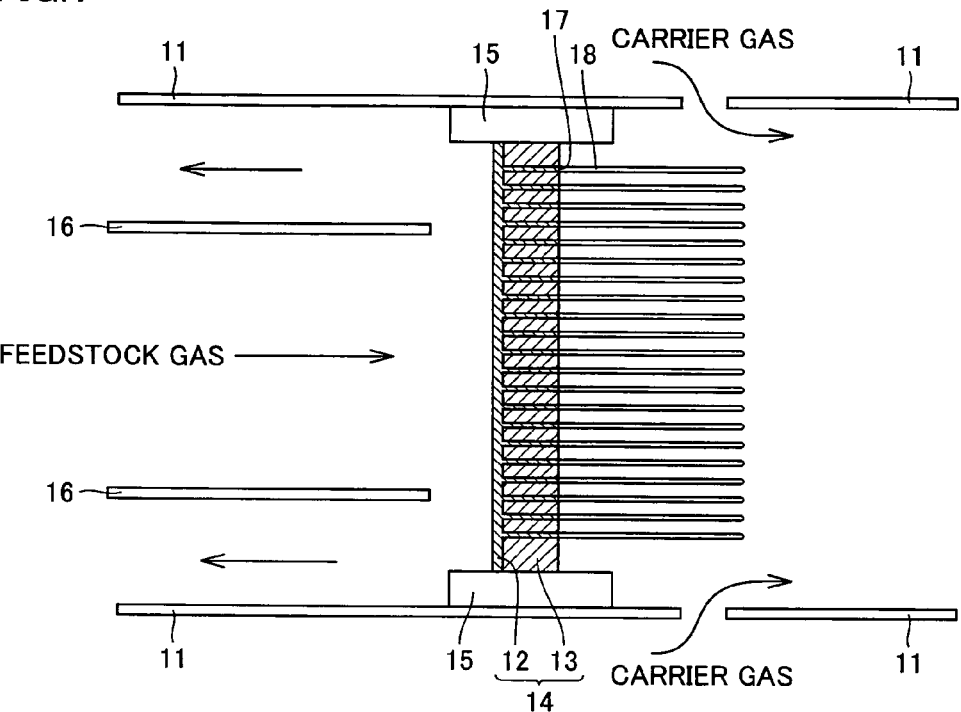
FIG. 1 is a cross-sectional view showing one embodiment of a manufacturing method of the present invention.

DESCRIPTION OF THE REFERENCE SIGNS 11, 21, 61 furnace tube; 12, 31, 42, 52, 62, 81 catalyst material; 13, 32, 43, 53, 63, 82 non-catalytic material; 14, 22, 33, 4, 5, 64 catalytic base; 15, 23 sealing member; 16, 24 diaphragm; 17, 37, 44, 54 crystal growth surface; 18, 25, 38, 66, 83, 92 carbon nanostructure; 34 reinforce material; 35 heat source; 36 temperature stabilizing apparatus; 41, 51, 71 assembly; 55 catalytic material layer; 65 anode; 72 ring; 91 catalytic nanoparticle; L separation wall.

BEST MODES FOR CARRYING OUT THE INVENTION

The manufacturing method of the present invention is characterized in that at least two conditions for bringing an ambient gas into contact with a catalytic base are set simultaneously, and the ambient gas is one gas or at least two gases including at least one feedstock gas. In the present invention, by exerting control so that dissolution of carbon due to pyrolysis of the feedstock gas and precipitation of crystalline carbon occur at separate portions of a catalytic base surface, the precipitation rate of crystalline carbon from the crystal grow surface is improved while generation of impurities is suppressed, whereby carbon nanostructures having a uniform shape can be produced in an excellent manufacturing efficiency.

The ambient gas used in the present embodiment is preferably constituted by at least one feedstock gas and at least one carrier gas. Thus, dissolution of carbon hardly occurs at a portion of the catalyst material in contact with the carrier gas, and the carbon dissolution portion and the crystalline carbon precipitation portion can be separated more clearly. Therefore, carbon nanostructures having a more uniform shape can be produced.

The ambient gas is preferably supplied so that carbon is continuously supplied to the crystalline carbon through inside of the catalytic material. In this case, carbon produced by pyrolysis of the feedstock gas in the portion of the catalytic material in contact with the feedstock gas moves inside the catalytic material in the presence of the ambient gas and reaches the crystal growth surface. Thus, supply of carbon from inside of the catalytic material to the crystal growth surface is performed in a stable manner, and a carbon nanostructure having a desired shape can be produced efficiently.

In special, it is preferable that control is exerted such that the feedstock gas is not brought into contact with the crystal growth surface of the catalytic base, and such that the feedstock gas is brought into contact with at least a part of region except for the crystal growth surface. The feedstock gas brought into contact with the catalytic material at the region except for the crystal growth surface causes pyrolysis and produces carbon, whereby the carbon is dissolved into the catalytic material. The carbon moving inside the catalytic material reaches the crystal growth surface and precipitates as crystalline carbon, and thereby forms a carbon nanostructure. By not bringing the feedstock gas into contact with the crystal growth surface, not only separation of the carbon dissolution portion and the crystalline carbon precipitation portion can be achieved, but also generation of by-products that tends occur when a carbon source is in the ambient gas near the crystal growth surface can effectively be prevented.

As a gas used in the present invention, for example, while only one feedstock gas, a combination of two gases that are the feedstock gas and the carrier gas may be employed, a combination of three or more gases can also be employed. Specifically, such a combination is possible that a feedstock gas is brought into contact with a catalytic material, a first carrier gas for promoting growth of a carbon nanostructure is supplied near the crystal growth surface, and a second carrier gas for moving the produced carbon nanostructure is supplied. Also, a combination with a gas suppressing precipitation of carbon from the feedstock gas itself and from a portion of the catalyst base in contact with the feedstock gas can be employed.

Figure 9:
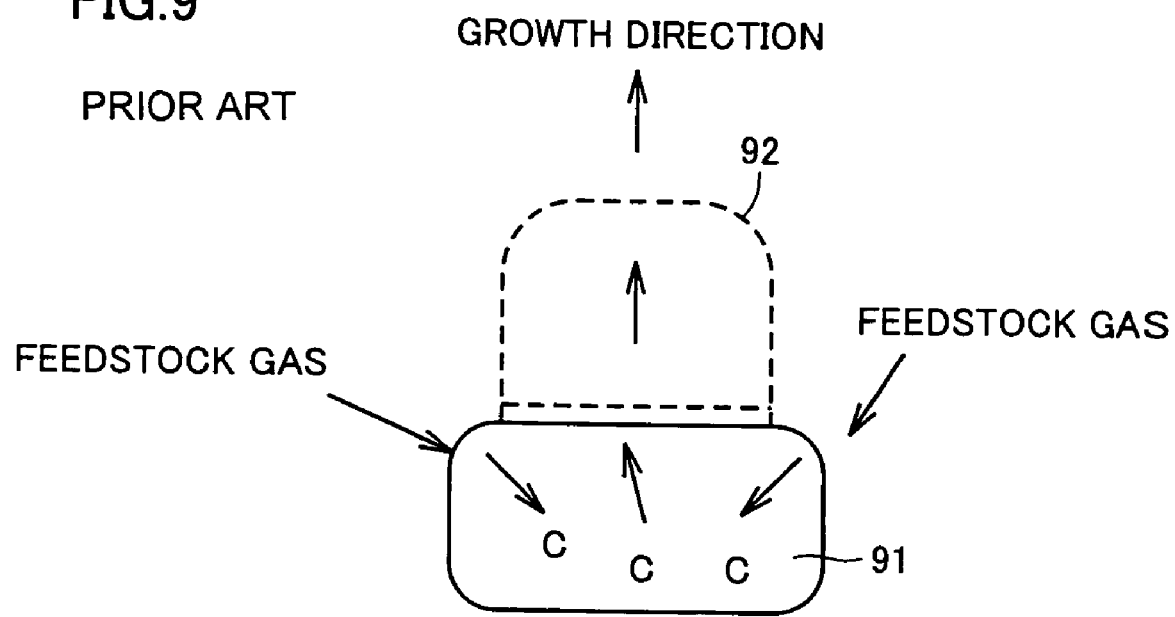
FIG. 9 is a cross-sectional view illustrating an exemplary growth mechanism of crystalline carbon in a conventional method.

FIG. 9 is a cross-sectional view illustrating an exemplary growth mechanism of crystalline carbon in a conventional method. In the conventional method, by pyrolysis of a feedstock gas on the surface of a catalytic nanoparticle 91, carbon dissolves into the catalyst. This causes a supersaturation state, whereby crystalline carbon precipitates on the catalyst surface, and a carbon nanostructure 92 grows. However, the shape of a catalytic nanoparticle is not stable, and the portion where carbon dissolves or precipitates is not specified. Accordingly, there is a problem that it is extremely difficult to control the shape or size of growing carbon nanostructure 92, and that variation of shape tends to occur.

Figure 8:
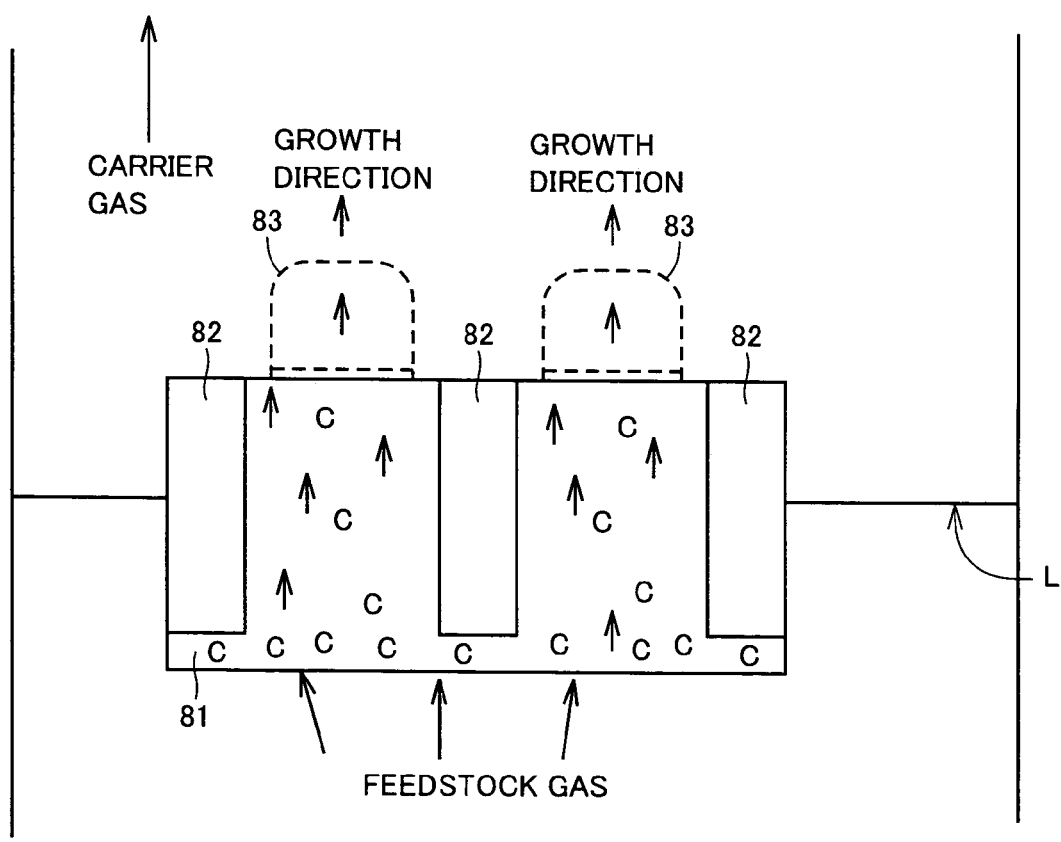
FIG. 8 is a cross-sectional view illustrating an exemplary growth mechanism of crystalline carbon in the present invention.

FIG. 8 is a cross-sectional view illustrating an exemplary growth mechanism of crystalline carbon in the present invention. In the example shown in FIG. 8, a catalyst base constituted by a catalytic material 81 and a non-catalytic material 82 is brought into contact with a feedstock gas and a carrier gas respectively supplied to spaces separated by a separation wall L. Carbon produced by pyrolysis of the feedstock gas moves inside catalytic material 81 and reaches the carrier gas supplying side, where it precipitate as crystalline carbon. Thus, a carbon nanostructure 83 grows. In the present invention, since the portions where carbon dissolves and the portion where carbon precipitates are different, carbon nanostructures of a uniform shape are produced efficiently.

In the present invention, it is preferable that at least two conditions for bringing the catalytic material into contact with the ambient gas are simultaneously set by setting the one ambient gas or at least two ambient gases to be brought into contact with the catalytic base with at least two different pressures. In this case, by the pressure difference of the ambient gas, the growth rate of a carbon nanostructure or the structure of a resulting carbon nanostructure such as the number of layers can be controlled.

In special, it is preferable that the pressure of the ambient gas at the portion of the catalytic base in contact with the feedstock gas is set to be higher than the pressure of the ambient gas near the crystal growth surface. In this case, the carbon produced by pyrolysis of the feedstock gas is taken inside the catalytic material more efficiently.

Further, it is also preferable that at least one ambient gas is supplied so as to be in contact with the catalytic base at a pressure higher than the atmospheric pressure. When the feedstock gas is brought into contact with the catalytic base at a pressure higher than the atmospheric pressure, carbon is taken inside the catalytic material more efficiently. Additionally, by setting the pressure of the ambient gas near the crystal growth surface and the pressure of the ambient gas at the feedstock gas supplying side to be equal, deformation of the catalytic base can be suppressed.

Further, it is also preferable that the surface area of the catalytic material brought into contact with the feedstock gas at the catalytic base surface is set to be greater than the surface area of the crystal growth surface. In this case, carbon produced from pyrolysis of the feedstock gas is supplied to the crystal growth surface in higher concentration, and therefore excellent manufacturing efficiency of the carbon nanostructures is attained.

In the present invention, it is also preferable that a carrier gas for moving crystalline carbon precipitated from the crystal growth surface is supplied. In special, when the carrier gas is converged at least at one portion after passing near the crystal growth surface, the carbon nanostructures produced by the precipitation of crystalline carbon are twisted together and aggregated, and thus they can easily and efficiently be collected.

It is also preferable that the carrier gas is supplied so as to form a vortex after passing near the crystal growth surface. In this case also, the produced carbon nanostructures are twisted together and aggregated, and thus they can easily and efficiently be collected.

In the present invention, it is preferable to provide a heat source for changing a temperature near the crystal growth surface. Increasing the temperature near the crystal growth surface, the concentration of carbon that can be contained in the catalytic material increases. Decreasing the temperature near the crystal growth surface in this state, the carbon content of the catalytic material is reduced, whereby, from the catalytic material surface in contact with free space, that is, from the crystal growth surface, carbon precipitates. In other words, by changing the temperature near the crystal growth surface, precipitation of carbon can be promoted efficiently.

Although the manner of providing the heat source is not specifically limited so long as the temperature near the crystal growth surface can be changed, for example, a method where the heat source is installed in contact with the side face of the catalytic base, a method where light such as laser light is irradiated and the like may be employed.

The temperature near the crystal growth surface can be changed relative to the temperature that is set as the carbon nanostructure producing temperature in a range of, for example, +/−5° C. and in a cycle of about 0.1-60 seconds. In this case, while maintaining the uniformity of the shape of carbon nanostructure being produced, the manufacturing efficiency can be improved.

When changing the temperature near the crystal growth surface, it is preferable that, near the portion of catalytic base in contact with the feedstock gas, the variation of the temperature is maintained to be, for example, at most +/−1° C. Thus, the carbon produced by pyrolysis of the feedstock gas is supplied inside the catalytic material in a stable manner. As for a method for maintaining the temperature of the portion of catalytic base in contact with the feedstock gas constantly, a method where a temperature stabilizing apparatus (heat sink) is provided near the portion or the like may be employed.

The temperature at which the carbon nanostructures are produced is not specifically limited, and may be selected as appropriate according to the characteristics of the catalytic base, the type of feedstock gas being employed and the like. For example, it may be set to about 500° C.-900° C. However, it should be noted that some manufacturing conditions may cause deformation of the catalytic material. Further, impurities may be attached to the catalytic material surface and the catalytic material may be alloyed or combined, whereby the quality thereof may be altered where the catalytic activity is deteriorated. When the crystal growth surface of the catalytic material is deformed and the quality thereof is altered, it is difficult to ensure growth of the carbon nanostructures having a desired shape. Therefore, the temperature at which the carbon nanostructures are produced may be set at most to the temperature not causing deformation of the catalytic base or alteration of the quality thereof.

The feedstock gas used in growing a carbon nanostructure in the present invention may be: a hydrocarbon base gas such as ethylene gas, acetylene gas; an alcohol base gas such as methyl alcohol, ethyl alcohol; carbon monoxide, or other gases generally in use for manufacturing carbon nanostructures. An alcohol base gas, capable of producing carbon nanostructures at lower temperatures, may preferably be used when the catalytic base is made of materials with relatively low deformation temperatures, for example.

On the other hand, as the carbon nanostructures may possibly be decomposed by a hydrogen gas or the like, it is preferable to use a gas that does not substantially alter the quality of the produced crystalline carbon as a carrier gas near the crystal growth surface. Preferable carrier gases may include, for example, an inert gas such as argon, nitrogen and the like.

Although the catalytic base used in the present invention may be formed only by the catalytic material, it is preferable that the catalytic base is formed as a composite of a catalytic material having a catalytic action to the growth of crystalline carbon and a non-catalytic material having substantially no catalytic activity to the growth of crystalline carbon. For example, as shown in FIG. 8, when non-catalytic material 82 is formed in contact with catalytic material 81, the non-catalytic material prevents the crystalline carbon from being spread in the direction of the crystal growth surface, which allows crystals to be grown in a controlled direction. Thus, production of the carbon nanostructures having a more uniform shape is enabled.

When the catalytic base is constituted by a catalytic material and a non-catalytic material, it is preferable that the catalytic material is only exposed in a portion of the crystal growth surface in contact with the material gas, while the non-catalytic material is exposed in the other area. In this case, precipitation of crystalline carbon from the portion except for the crystal growth surface can be prevented, and the uniformity of the carbon nanostructures can be improved.

As the catalytic material, a material generally in use for manufacturing carbon nanostructures may be used, and specifically, it may include Fe, Co, Mo, Ni, In, Sn or an alloy containing them. They may be used singularly or may be used as a combination of at least two. Among them, Fe, Co and Fe—Co alloy materials are suitable since they substantially do not form an alloy with Ag, which may preferably used as a non-catalytic material as will be described later, and hardly alter their quality as a catalyst.

As the non-catalytic material, a material that has substantially no catalytic activity to the growth of crystalline carbon may be used. Specifically, it may be a precious metal such as Ag, Au, Ru, Rh, Pd, Os, Ir, Pt and the like or an alloy containing such precious metal. They may be used singularly or in combination of at least two. Among them, Ag and Ag containing alloys are suitable since they are relatively low-cost, easy to work and chemically stable. As the Ag containing alloys, Ag—Pd alloys, Ag—Pt alloys or the like may be used.

Preferably, when a catalytic base constituted by a composite of a catalytic material and a non-catalytic material is used, it is preferable that the catalytic material and the non-catalytic material are used in a combination that substantially does not cause production of alloy or reaction due to the contact between them, and that exhibits little risk of impairing the form of the crystal growth surface. Such a combination may be, for example: the combination of an oxide for the catalytic material and Ag or an Ag containing alloy for the non-catalytic material; the combination of a nitride for the catalytic material and Ag or an Ag containing alloy for the non-catalytic material, and the like. Further, the combination of at least one selected from the group consisting of Fe, Co, Mo, Ni, In, and Sn for the catalytic material and Ag and/or Ag containing alloy for the non-catalytic material is also preferable.

It is preferable that the catalytic base used in the present invention is structured so that carbon supplied to the portion in contact with the feedstock gas can move inside the catalytic material to reach the crystal growth surface. In order to efficiently produce the carbon nanostructures, for example, a catalytic base which is formed by a plurality of catalytic structures of a columnar shape in which a catalytic material and a non-catalytic are formed in a manner of column, pipe, or spiral may preferably be used. By using a catalyst base formed of a plurality of catalytic structures, the manufacturing efficiency of the carbon nanostructures can be improved.

The top surface of the aforementioned columnar catalyst structure may be the crystal growth surface. It is preferable if a non-catalytic material is further formed at least at one portion of the side surface of the assembly, since non-uniformity in the shape of the carbon nanostructures due to spreading of the produced crystalline carbon in a direction of crystal growth can be prevented.

When the catalytic material is formed by arranging a plurality of catalytic structures constituted by a catalytic material and a non-catalytic material, it is preferable that the variation among the catalytic structures in the surface area of the catalytic material measured on the crystal growth surface is preferably at most 10% in CV. In this case, the shape of the catalytic material on the crystal growth surface is uniform, which ensures uniformity of cross-sectional shape of the carbon nanostructures. The surface area of the catalytic material may be calculated by means of, for example, image analysis based on the observed morphology in scanning tunneling microscopy (STM).

When a composite of a catalytic material and a non-catalytic material is used as the catalytic base, it is preferable that a reinforce material for suppressing deformation of the catalytic base is formed at least at a part of the catalytic base. Additionally, it is specifically preferable that the reinforce material is formed so as to cover at least a part of the catalytic base at the periphery of the catalytic base. In this case, the reinforce material suppresses occurrence of clearance between the catalytic material and the non-catalytic material, and prevents generation of a carbon nanostructure as a by-product from an interface between the catalytic material and the non-catalytic material. Thus, uniformity of the carbon nanostructures can further be improved. As the reinforce material, a material having Young's modulus greater than the catalytic base constituted by the catalytic material and the non-catalytic material is preferably used. In special, one greater in heat-resistance than the non-catalytic material is preferably used. Specifically, for example, it may be a heat-resistance high-strength metal such as tungsten-carbide, ceramics and Inconel.

When the catalytic material has a multi-layer structure in the catalytic base used in the present invention, by exposing the multi-layer structure of the catalytic material at the crystal growth surface, a multi-layer carbon nanostructure can be produced that reflects the multi-layer structure. Accordingly, when a carbon nanostructure of a multi-layer structure is desired, it is also preferable that the catalytic material is formed to have a multi-layer structure.

The catalytic base including the catalytic material having the multi-layer structure may be formed, for example as shown in the aforementioned FIG. 8, by interposing a non-catalytic material between catalytic materials having a plurality of layers and the like.

The catalytic base used in the present invention may be formed so that the crystal growth surface of the catalytic material has at least one of circular, ring, polygonal, spiral, and corrugated shape. Thus, a carbon nanotube, a carbon nanofiber and the like of which cross-sectional shape is the shape of the catalytic material at the crystal growth surface can be produced. In other words, by selecting the shape of the crystal growth surface as appropriate, a carbon nanostructure of a desired shape can easily be manufactured in accordance with various applications.

In the present invention, in order to smooth the crystal growth surface and to improve uniformity of the resulting carbon nanostructures, it is preferable to provide in advance mechanical polishing and/or sputtering to the crystal growth surface. As sputtering, it is preferable to use at least one selected from the group consisting of plasma, ion beam, and laser beam, since the crystal growth surface can be processed further smoothly, and excellent working efficiency can be achieved. A cluster ion beam as the ion beam and a ultrashort pulse laser as the laser beam are respectively preferable.

To the crystal growth surface, it is preferable to provide in advance an oxidizing process before growing crystalline carbon. Thus, production efficiency of the carbon nanostructures can be improved. The oxidizing process can be performed, for example, by heat treatment under oxygen atmosphere.

To the crystal growth surface after growing a carbon nanostructure, it is preferable to provide reactivation process using at least one selected from the group consisting of chemical polishing, physical polishing and sputtering, for example. By reactivating the crystal growth surface, the catalytic base can be reused. Thus, the target carbon nanostructures can be manufactured at lower costs.

In the present invention, in order to more efficiently produce carbon nanostructures, it is preferable that an ambient gas brought into contact with the catalytic material, in special a feedstock gas, includes ion. In special, when the feedstock gas includes a carbon ion, by accelerating the carbon ion by an electric field so as to collide to the catalytic material, the solubility of the carbon to the catalytic material can be improved, and carbon can be permeated to the deeper portion of the catalytic material from the surface of the catalytic material in contact with the feedstock gas. Thus, carbon in a high concentration is supplied to the crystal growth surface, and the manufacturing efficiency of the carbon nanostructures can be improved. As a method where the feedstock gas is ionized to be brought into contact with the catalyst material, a plasma carburizing process is preferably used in particular.

The plasma carburizing process can be performed by the following method, for example. Specifically, between a furnace tube supplied with a feedstock gas containing at least a gas to be a carbon source and a catalytic base, a voltage is applied, so that plasma is generated by glow discharge. Carbon in the feedstock gas in particular is ionized, and simultaneously, the generated carbon ion is accelerated by an electric field and collided to the catalytic material. Thus, the carbon in a high concentration can be supplied inside the catalytic material.

The manufacture of the carbon nanostructure according to the present invention can be performed, for example, by the following method. FIG. 1 is a cross-sectional view showing one embodiment of the manufacturing method of the present invention. Into a furnace tube 11, which is a heat and pressure resistant metal tube having an electric furnace that is a heating apparatus, a gas introduce/evacuate system, a growth temperature control system, a vacuum control system, a gas flowmeter and the like, a catalytic base 14 formed by a catalytic material 12 and a non-catalytic material 13 is inserted. Eliminating clearance with a sealing member 15, catalytic base 14 is fixed to furnace tube 11. By catalytic base 14 and sealing member 15, furnace tube 11 is divided to have a space of the feedstock gas supplying side and a space of the carbon nanostructure growth side. In the space of the feedstock gas supplying side, for example a diaphragm 16 is provided, and a feedstock gas is supplied so as to flow in the direction represented by an arrow. To the space of the carbon nanostructure growth side, a carrier gas is supplied. Carbon produced by pyrolysis of the feedstock gas supplied to the space of the feedstock gas supplying side moves inside catalytic material 12 in catalytic base 14 and reaches a crystal growth surface 17, from which it precipitates as crystalline carbon, and a carbon nanostructure 18 grows.

Figure 2:
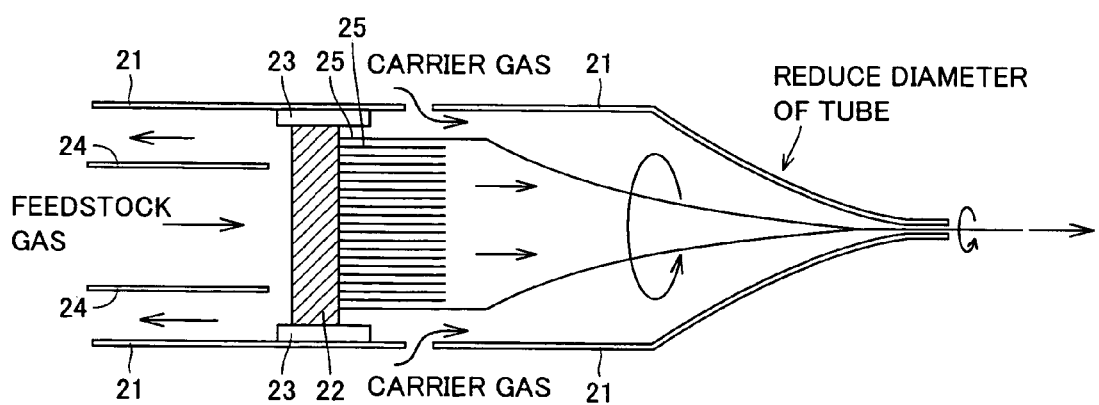
FIG. 2 is a cross-sectional view showing another embodiment of the manufacturing method of the present invention.

FIG. 2 is a cross-sectional view showing another embodiment of the manufacturing method of the present invention. Into a furnace tube 21, which is a heat and pressure resistant metal tube having an electric furnace that is a heating apparatus, a gas introduce/evacuate system, a growth temperature control system, a vacuum control system, a gas flowmeter and the like, a catalytic base 22 is inserted. Eliminating clearance with a sealing member 23, furnace tube 21 is divided to have two spaces of the feedstock gas supplying side and the carbon nanostructure growth side. To the space of the feedstock gas supplying side where a diaphragm 24 is provided, a feedstock gas is supplied in the direction represented by an arrow. To the space of the carbon nanostructure growth side, a carrier gas is supplied in the direction represented by an arrow. In the space of the carbon nanostructure growth side, the diameter of furnace tube 21 is reduced. Carbon produced by pyrolysis of the feedstock gas moves inside the catalytic material of catalytic base 22 and reaches the crystal growth surface, from which it precipitates as crystalline carbon, and carbon nanostructures 25 grow. The grown carbon nanostructures 25 are twisted together according to the vortex of the carrier gas that occurs as the diameter of furnace tube 21 is reduced, and rolled around a coil as aggregated.

Figure 3:
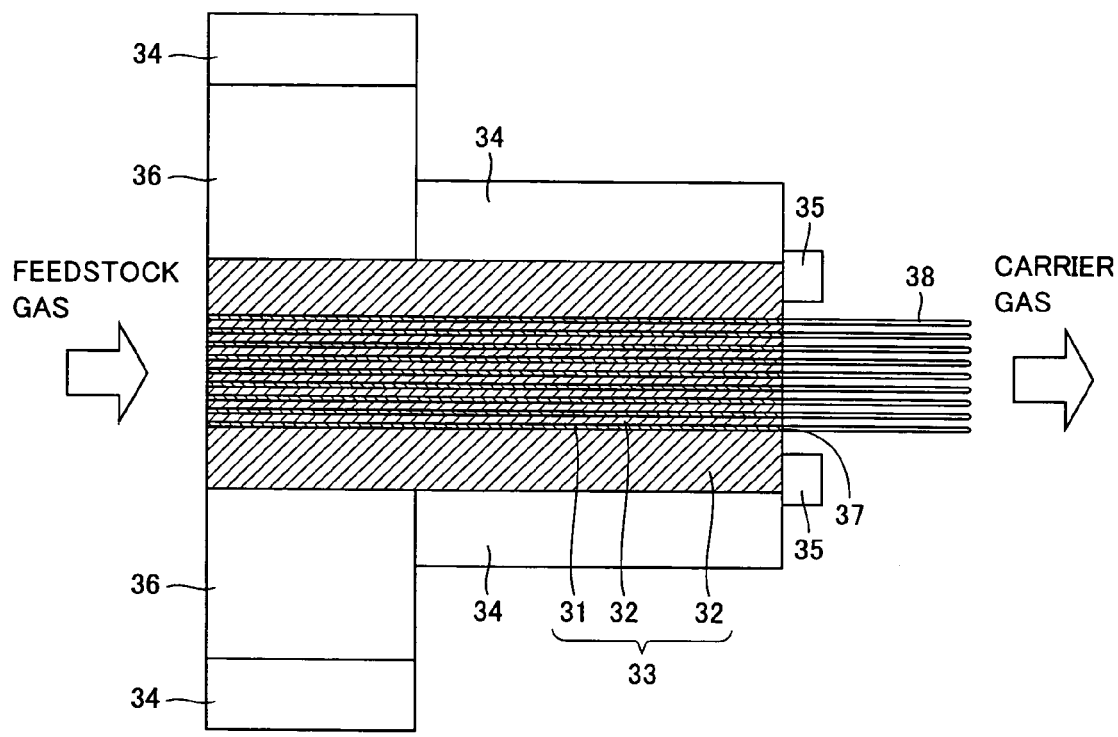
FIG. 3 is a cross-sectional view showing a structure of a catalytic base preferably applied to the present invention.

FIG. 3 is a cross-sectional view showing a structure of a catalytic base preferably applied to the present invention. Along the periphery of catalytic base 33 formed by a plurality of catalytic structures constituted by catalytic material 31 and non-catalytic material 32, a reinforce material 34 is formed. As a heat source 35 is provided near crystal growth surface 37, the temperature near crystal growth surface 37 can be changed. A temperature stabilizing apparatus 36 is arranged on the feedstock gas supplying side, and the temperature of a portion of catalytic base 33 in contact with the feedstock gas can be controlled constantly.

Figure 4:
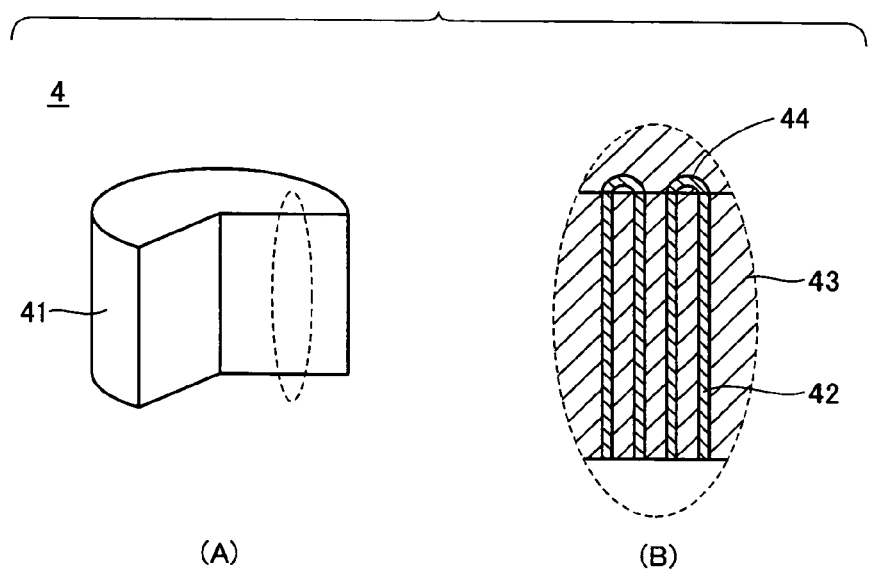
FIG. 4 shows an exemplary catalytic base preferably employed in the present invention.

FIG. 4 shows an exemplary catalytic base preferably employed in the present invention. As shown in FIG. 4(A) and FIG. 4(B) (where FIG. 4(B) is an enlarged view of an area in FIG. 4(A) enclosed by a dashed line), a cylindrical catalytic base 4 is formed as an assembly 41 where a plurality of columnar catalytic structures that is a composite of a catalytic material 42 and a non-catalytic material 43 are arranged, and structured so that a carbon nanostructure can be grown from a crystal growth surface 44.

Figure 5:
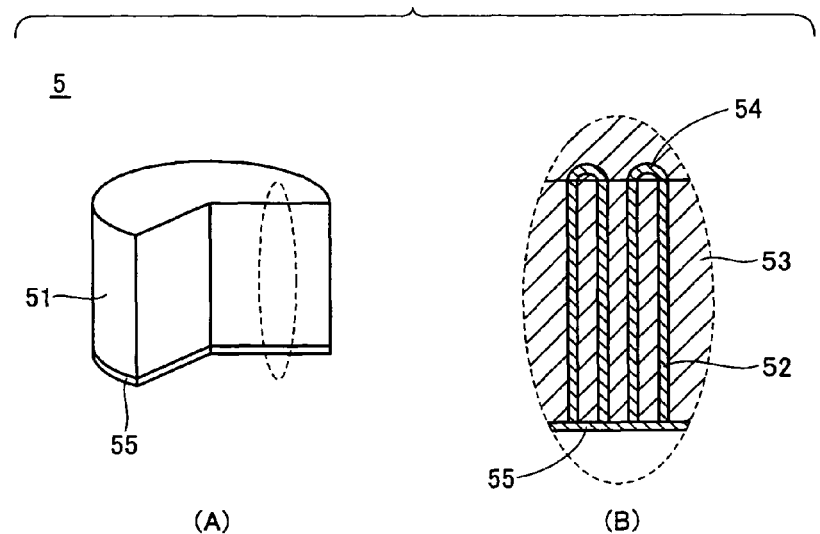
FIG. 5 shows another exemplary catalytic base preferably employed in the present invention.

FIG. 5 shows another exemplary catalytic base preferably employed in the present invention. As shown in FIG. 5(A) and FIG. 5(B) (where FIG. 5(B) is an enlarged view of an area in FIG. 5(A) enclosed by a dashed line), a cylindrical catalytic base 5 is formed as an assembly 51 where a plurality of columnar catalytic structures of a catalytic material 52 and a non-catalytic material 53 are arranged, and structured so that a carbon nanostructure can be grown from a crystal growth surface 54. Further, in catalytic base 5, a catalytic material layer 55 is formed on the opposite side to a crystal growth surface 54.

The catalytic base shown in FIG. 5 is structured such that catalytic material 52 and non-catalytic material 53 are exposed on crystal growth surface 54 side, and only the catalytic material is exposed on catalytic material layer 55 side. Accordingly, the surface area of the catalytic material exposed at catalytic material layer 55 is greater than the surface area of the catalytic material exposed at crystal growth surface 54. Thus, when the feedstock gas is brought into contact with catalytic material layer 55, carbon in higher concentration is supplied to crystal growth surface 54, and the carbon nanostructures can be manufactured efficiently.

The catalytic base used in the present invention must be prepared so that the crystal growth surface of the catalytic material has a very small geometry of nanometer level in accordance with the size and shape of a desired carbon nanostructure. A method of preparing a crystal growth surface of a very small geometry is not specifically limited, and includes, for example: repeated extrusion, wiredrawing and fitting of pipes or sheets of catalytic material to reduce the diameter to nanometer level; using photolithography to form a fine pattern of catalytic material on a substrate, and the like.

Figure 6:
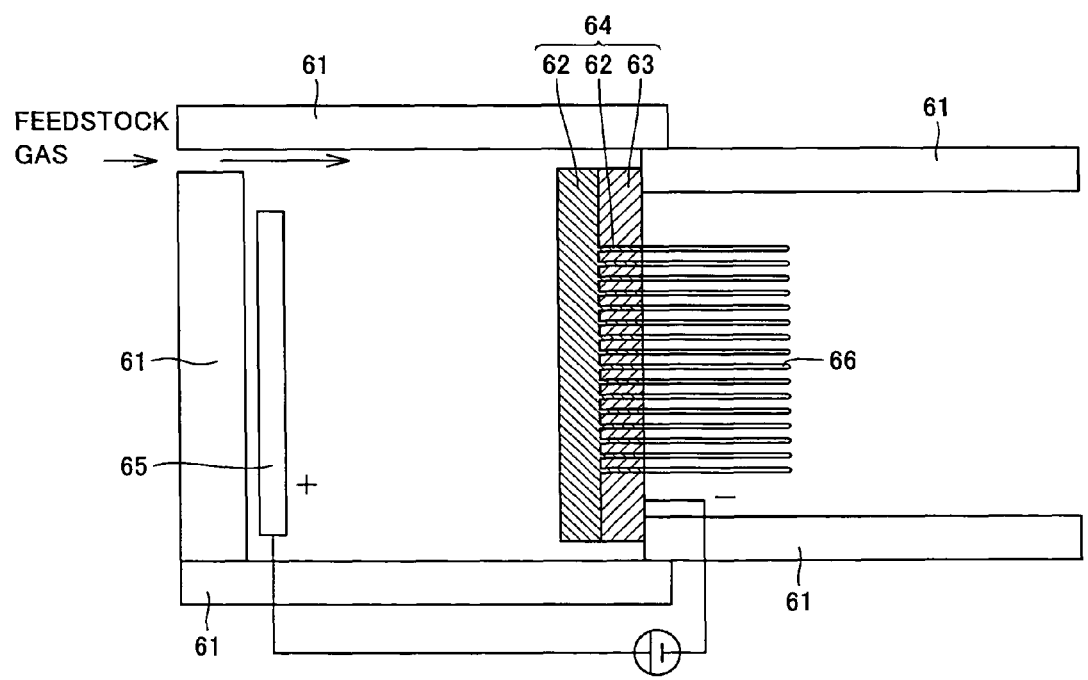
FIG. 6 shows an exemplary carbon nanostructure manufacturing apparatus with a plasma carburizing apparatus.

FIG. 6 shows an exemplary carbon nanostructure manufacturing apparatus with a plasma carburizing apparatus. Into a manufacturing apparatus constituted by a furnace tube 61, which is a heat and pressure resistant heat processing furnace tube having an electric furnace that is a heating apparatus, a gas introduce/evacuate system, a growth temperature control system, a vacuum control system, a gas flowmeter and the like, a catalytic base 64 formed by a catalytic material 62 and a non-catalytic 6 is inserted. The spade formed by furnace tube 61 is divided to have a space of crystal growth surface side and a space of non-crystal growth surface side. On the non-crystal growth side, an anode 65 is arranged. As a feedstock gas containing carbon source, for example, a mixture gas of a propane gas, a methane gas, an ethylene gas, a hydrogen gas, an argon gas and the like is supplied to the space of the non-crystal growth surface side. By applying a voltage between anode 65 and catalytic base 64 employing catalytic base 64 as a cathode, plasma is generated by glow discharge. In a state where carbon produced by decomposition of the feedstock gas is ionized, the carbon is supplied to the non-crystal growth surface.

The manufacturing apparatus of a carbon nanostructure used in the present invention may have a structure that can refine a feedstock gas containing a decomposed gas after production of the carbon nanostructures, by provision of, for example, a supplying mechanism of a refinement gas.

Carbon nanostructures manufactured according to the present invention has a uniform shape and high in purity, and thus can be suitable for a variety of applications including, for example, electronic circuitry, high-strength composite materials, electric wire materials, and cushion materials.

EXAMPLES

In the following, the present invention will be described in further detail showing examples. The present invention is not limited thereto.

Example 1

(1) Fabrication of Catalytic Base

An Fe (iron) pipe with an outer diameter of 40 mm and an inner diameter of 30 mm was inserted into an Ag (silver) pipe with an outer diameter of 60 mm and an inner diameter of 40 mm, and an Ag rod with an outer diameter of 30 mm was inserted into the Fe pipe. The combined metal material underwent wiredrawing until it had an outer diameter of 1.2 mm to provide a wire 1.

Wire 1 was cut into segments each with a length of 1 meter which were then bundled together, with which an Ag pipe with an outer diameter of 60 mm and an inner diameter of 50 mm was filled. The resulting material underwent wiredrawing until it had an outer diameter of 1.2 mm to provide a wire 2.

The step of producing wire 2 from wire 1 was repeated to ultimately provide an assembly that has a diameter of about 12 mm and that is made of a plurality of catalyst structures bundled together having Fe with an outer diameter of about 8 nm and an inner diameter of about 6 nm.

The assembly was cut into segments each with a length of 1 mm and their cross section surface was polished by abrasive, and thereafter the surface was sputtered using cluster ion beam so as to expose a portion of Fe on the cross section surface to fabricate a catalytic base having a shape shown in FIG. 4. The catalytic material has a cross section of a ring-like shape on the crystal growth surface.

A square area of the crystal growth surface with a side of 1 μm which was randomly selected in the fabricated catalytic base was observed by scanning tunneling microscopy (STM), and the cross section of the catalytic material for each catalyst structure was calculated and the variation in the cross section was determined using the equation below.

$$CV (\%) = \text{standard deviation of all measures/average of all measures} \times 100$$

As a result, a variation in the cross section of the catalytic material on the crystal growth surface was at most 10% in CV (%).

(2) Manufacture of Carbon Nanostructures

The catalytic base obtained as above was used to manufacture carbon nanotubes as carbon nanostructures in a manufacturing apparatus as in FIG. 1. Into furnace tube 11, which was a heat and pressure resistant metal tube having an electric furnace that was a heating apparatus, a gas introduce/evacuate system, a growth temperature control system, a vacuum control system, a gas flowmeter and the like, a catalytic base 14 was inserted. Clearance between furnace tube 11 and catalytic base 14 was eliminated by sealing member 15.

The temperature inside the electric furnace was set to 580° C., at which temperature carbon nanotubes were produced. An argon gas was supplied to the space of the feedstock gas supplying side out of the spaces separated by sealing member 15. Thereafter, the supply of argon gas was stopped and, as the feedstock gas, ethyl alcohol vapor was flown into the metal tube to attain 1 atmosphere. To the space of the carbon nanotube growth side out of the spaces separated by sealing member 15, an argon gas was flown as the carrier gas to attain 1 atmosphere.

As a result, production of carbon fibers from the catalytic base surface of the carbon nanotube growth side (that is, the crystal growth side) was visually recognized. The resulting carbon fibers were observed by transmission electron microscopy (TEM) and Raman spectroscopy, and carbon nanotubes were recognized, while substantially no by-product such as amorphous carbon or graphite had been produced.

The catalytic base 14 was removed from furnace tube 11 and, after an observation of the crystal growth surface, was inserted back again into furnace tube 11 to attempt to produce carbon nanotubes, and substantially no new carbon nanotubes were produced. However, growth of carbon nanotubes was observed when the crystal growth surface of the removed catalytic base 14 had been mechanically polished and surface treatment had been provided by cluster ion beam to expose catalytic material 12 before catalytic base 14 was introduced back into furnace tube 11 to produce carbon nanotubes.

Example 2

(1) Fabrication of Catalytic Base

An Fe—Co (iron-cobalt) alloy pipe with an outer diameter of 50 mm and an inner diameter of 40 mm was inserted into a Ag—Pd (silver-palladium) alloy pipe with an outer diameter of 60 mm and an inner diameter of 50 mm, and an Ag—Pd alloy rod with an outer diameter of about 40 mm was inserted into the Fe—Co alloy pipe. The combined metal material underwent wiredrawing until it had an outer diameter of 1.2 mm to provide a wire 1.

Wire 1 was cut into segments each with a length of 1 meter which were then bundled together, with which an Ag—Pd alloy pipe with an outer diameter of 60 mm and an inner diameter of 50 mm was filled. The resulting material underwent wiredrawing until it had an outer diameter of 1.2 mm to provide a wire 2.

The step of producing wire 2 from wire 1 was repeated to ultimately provide an assembly that has a diameter of about 12 mm and that is made of a plurality of catalyst structures bundled together having Fe—Co with an outer diameter of about 10 nm and an inner diameter of about 8 nm.

The assembly was cut into segments each with a length of 1 mm and their cross section surface was polished by abrasive, and thereafter the surface was sputtered using cluster ion beam so as to expose a portion of Fe—Co on the cross section surface.

Thereafter, an Fe thin film is further formed on only one of the surfaces. The thin film and the Fe portion in the assembly was connected to fabricate a catalytic base having a shape shown in FIG. 5. The catalytic material has a cross section of a ring-like shape on the crystal growth surface.

A square area of the crystal growth surface with a side of 1 μm which was randomly selected in the fabricated catalytic base was observed by scanning tunneling microscopy (STM), and the cross section of the catalytic material for each catalyst structure was calculated and the variation in the cross section was determined using the equation below.

$$CV (\%) = \text{standard deviation of all measures/average of all measures} \times 100$$

As a result, a variation in the cross section of the catalytic material on the crystal growth surface was at most 10% in CV (%).

(2) Manufacture of Carbon Nanostructures

The catalytic base obtained as above was used to manufacture carbon nanotubes as carbon nanostructures in a manufacturing apparatus as in FIG. 1. Into furnace tube 11, which was a heat and pressure resistant metal tube having an electric furnace that was a heating apparatus, a gas introduce/evacuate system, a growth temperature control system, a vacuum control system, a gas flowmeter and the like, a catalytic base 14 was inserted so as to expose the Fe thin film of the catalytic base to the feedstock gas supplying side. Clearance between furnace tube 11 and catalytic base 14 was eliminated by sealing member 15.

The temperature inside the electric furnace was set to 680° C., at which temperature carbon nanotubes were produced. An argon gas was supplied to the space of the feedstock gas supplying side out of the spaces separated by sealing member 15. Thereafter, the supply of argon gas was stopped and, as the feedstock gas, an acetylene gas ($C_2H_2$) was flown into furnace tube 11 to attain 1 atmosphere. To the space of the carbon nanotube growth side out of the spaces separated by sealing member 15, an argon gas was flown as the carrier gas to attain 0.5 atmosphere.

As a result, production of carbon fibers from the catalytic base surface of the carbon nanotube growth side (that is, the crystal growth side) was visually recognized. The resulting carbon fibers were observed by transmission electron microscopy (TEM) and Raman spectroscopy, and carbon nanotubes were recognized, while substantially no by-product such as amorphous carbon or graphite had been produced.

The catalytic base was removed from the furnace tube and, after an observation of the crystal growth surface, was inserted back again into the furnace tube to attempt to produce carbon nanotubes, and substantially no new carbon nanotubes were produced. However, growth of carbon nanotubes was observed when the crystal growth surface of the removed catalytic base had been mechanically polished and surface treatment had been provided by cluster ion beam to expose the catalytic material before catalytic base was introduced back into furnace tube to produce carbon nanotubes.

Example 3

(1) Fabrication of Catalytic Base

An Fe—Co—Mo (iron-cobalt-molybdenum) alloy pipe with an outer diameter of 30 mm and an inner diameter of 20 mm was inserted into an Ag (silver) pipe with an outer diameter of 50 mm and an inner diameter of 30 mm, and an Ag pipe with an outer diameter of about 20 mm was inserted into the Fe—Co—Mo alloy pipe. The combined metal material underwent wiredrawing until it had an outer diameter of 1.2 mm to provide a wire 1.

Wire 1 was cut into segments each with a length of 1 meter which were then bundled together, with which an Ag pipe with an outer diameter of 50 mm and an inner diameter of 40 mm was filled. The resulting material underwent wiredrawing until it had an outer diameter of 1.2 mm to provide a wire 2. The step of producing wire 2 from wire 1 was repeated to ultimately provide an assembly that has a diameter of about 12 mm and that is made of a plurality of catalyst structures bundled together having Fe—Co—Mo with an outer diameter of about 6 nm and an inner diameter of about 4 nm.

The assembly was cut into segments each with a length of 3 mm and their cross section surface was polished by abrasive, and thereafter the surface was sputtered using cluster ion beam so as to expose a portion of Fe—Co—Mo on the cross section surface. Using this assembly, a catalytic base was produced. The catalytic material has a cross section of a ring-like shape on the crystal growth surface.

Figure 7:
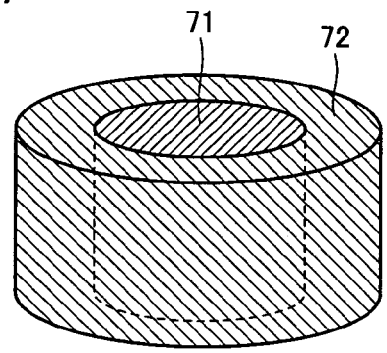
FIG. 7 shows a catalytic base produced in Example 3.

FIG. 7 shows the catalytic base fabricated in Example 3. Around the outer periphery of columnar assembly 71 provided as above, a ring 72 made of WC (tungsten carbide) was fitted without clearance. Thus, the catalytic base was fabricated.

A square area of the crystal growth surface with a side of 1 μm which was randomly selected in the fabricated catalytic base was observed by scanning tunneling microscopy (STM), and the cross section of the catalytic material for each catalyst structure was calculated and the variation in the cross section was determined using the equation below.

$$CV\,(\%)\text{ standard deviation of all measures/average of all measures} \times 100$$

As a result, a variation in the cross section of the catalytic material on the crystal growth surface was at most 10% in CV (%).

(2) Manufacture of Carbon Nanostructures

The catalytic base fabricated as above was used to manufacture carbon nanotubes as carbon nanostructures in a manufacturing apparatus as in FIG. 1. Into furnace tube 11, which was a heat and pressure resistant metal tube having an electric furnace that was a heating apparatus, a gas introduce/evacuate system, a growth temperature control system, a vacuum control system, a gas flowmeter and the like, a catalytic base 14 was inserted. Clearance between furnace tube 11 and catalytic base 14 was eliminated by sealing member 15.

The temperature inside the electric furnace was set to 820° C., at which temperature carbon nanotubes were produced. An argon gas was supplied to the space of the feedstock gas supplying side out of the spaces separated by sealing member 15. Thereafter, the supply of argon gas was stopped and replaced by acetylene gas ($C_2H_2$) of the feedstock gas. Thereafter, pressure is applied to the catalytic base to attain 2 atmospheres. To the space of the carbon nanotube growth side out of the spaces separated by sealing member 15, an argon gas was flown as the carrier gas to attain 1 atmosphere. A hydrogen gas produced by decomposition of the acetylene gas was evacuated to the outside of the system of furnace tube 11 using a hydrogen separation membrane. As a result, production of carbon fibers from the catalytic base surface of the carbon nanotube growth side (that is, the crystal growth side) was visually recognized.

As shown in FIG. 2, in the present example, the diameter of furnace tube 21 was reduced so that its inner diameter attains about 6 mm on the carbon nanotube growth side, and an argon gas was flown as a carrier gas along the wall of furnace tube 21. As a result, a plurality of carbon nanotubes produced in an area of a diameter of 10 mm of the crystal growth surface were twisted together so that the diameter of at most 1 mm was attained along furnace tube 21. Finally, the twisted carbon nanotubes are rolled around a coil and collected.

The collected carbon fibers were observed by transmission electron microscopy (TEM) and Raman spectroscopy, and carbon nanotubes were recognized, while substantially no by-product such as amorphous carbon or graphite had been produced.

Example 4

(1) Fabrication of Catalytic Base

An Fe (iron) pipe with an outer diameter of 30 mm and an inner diameter of 20 mm was inserted into a Ag pipe with an outer diameter of 50 mm and an inner diameter of 30 mm, and an Ag pipe with an outer diameter of about 20 mm was inserted into the Fe pipe. The combined metal material underwent wiredrawing until it had an outer diameter of 1.2 mm to provide a wire 1.

Wire 1 was cut into segments each with a length of 1 meter which were then bundled together, with which an Ag pipe with an outer diameter of 50 mm and an inner diameter of 30 mm was filled. The resulting material underwent wiredrawing until it had an outer diameter of 1.2 mm to produce a wire 2. The step of producing wire 2 from wire 1 was repeated to ultimately provide an assembly that has a diameter of about 4 mm and that is made of a plurality of catalyst structures bundled together having Fe with an outer diameter of about 6 nm and an inner diameter of about 4 nm.

The assembly was cut into segments each with a length of 20 mm and their cross section surface was polished by abrasive, and thereafter the surface was sputtered using gas cluster ion beam so as to expose a portion of Fe on the cross section surface. The catalytic material has a cross section of a ring-like shape on the crystal growth surface.

As shown in FIG. 3, a ring made of Ag that had a diameter of 20 mm and that was used as temperature stabilizing apparatus 36 was fitted to half the feedstock gas supplying side out of the assembly periphery, and a heat-resistant high-strength metal ring made of Inconel as reinforce material 34 is fitted to half the crystal growth surface side out of the assembly periphery and to the periphery of the Ag ring without clearance. Further, a heat source 35 is provided near the crystal growth surface, and a catalytic base was obtained.

(2) Manufacture of Carbon Nanostructures

The catalytic base obtained as above was used to manufacture carbon nanotubes as carbon nanostructures in a manufacturing apparatus as in FIG. 1. Into furnace tube 11, which was a heat and pressure resistant metal tube having an electric furnace that was a heating apparatus, a gas introduce/evacuate system, a growth temperature control system, a vacuum control system, a gas flowmeter and the like, a catalytic base 14 was inserted. Clearance between furnace tube 11 and catalytic base 14 was eliminated by sealing member 15.

The temperature inside the electric furnace was set to 650° C., at which temperature carbon nanotubes were produced, while an argon gas was supplied to the space of the feedstock gas supplying side out of the spaces separated by sealing member 15. It is noted that, by a heat source provided near the crystal growth surface, the temperature near the crystal growth surface was changed with a variation width of about 10° C. and in a cycle of 10 seconds. A fluctuation width of the temperature on the feedstock gas supplying side was confirmed to be at most 1° C.

Thereafter, the supply of argon gas was stopped and, as the feedstock gas, an acetylene gas ($C_2H_2$) was flown into furnace tube 11 to attain 2 atmospheres relative to the catalytic base. To the space of the carbon nanotube growth side out of the spaces separated by sealing member 15, an argon gas was flown as the carrier gas to attain 2 atmospheres. As a result, production of carbon fibers from the catalytic base surface of the carbon nanotube growth side (that is, the crystal growth side) was visually recognized.

As shown in FIG. 2, in the present example, the diameter of furnace tube 21 was reduced so that its inner diameter attains about 4 mm on the carbon nanotube growth side, and an argon gas was flown as a carrier gas along the wall of furnace tube 21. As a result, a plurality of carbon nanotubes produced in an area of a diameter of 10 mm of the crystal growth surface were twisted together so that the diameter of at most 1 mm was attained along furnace tube 21. Finally, the twisted carbon nanotubes are rolled around a coil and collected.

The collected carbon fibers were observed by transmission electron microscopy (TEM) and Raman spectroscopy, and carbon nanotubes were recognized, while substantially no by-product such as amorphous carbon or graphite had been produced.

Example 5

(1) Fabrication of Catalytic Base

An Fe (iron) pipe with an outer diameter of 50 mm and an inner diameter of 40 mm was inserted into an Ag (silver) pipe with an outer diameter of 60 mm and an inner diameter of 50 mm, and an Ag rod with an outer diameter of 45 mm was inserted into the Fe pipe. The combined metal material underwent wiredrawing until it had an outer diameter of 1.2 mm to provide a wire 1.

Wire 1 was cut into segments each with a length of 1 meter which were then bundled together, with which an Ag pipe with an outer diameter of 60 mm and an inner diameter of 50 mm was filled. The resulting material underwent wiredrawing until it had an outer diameter of 1.2 mm to provide a wire 2.

The step of producing wire 2 from wire 1 was repeated to ultimately provide an assembly that has a diameter of about 12 mm and that is made of a plurality of catalyst structures bundled together having Fe with an outer diameter of about 10 nm and an inner diameter of about 8 nm.

The assembly was cut into segments each with a length of 3 mm and their cross section surface was buffing-polished by abrasive, and thereafter the surface was sputtered using cluster ion beam employing an argon gas so as to expose Fe-ring portions. Thus, a catalytic base was produced.

(2) Manufacture of Carbon Nanostructures

The catalytic base produced as above was used to manufacture carbon nanotubes as carbon nanostructures in a manufacturing apparatus as in FIG. 2. Into furnace tube 21, which was a heat and pressure resistant metal tube having an electric furnace that was a heating apparatus, a gas introduce/evacuate system, a growth temperature control system, a gas flowmeter and the like, a catalytic base 22 was inserted. Clearance between furnace tube 21 and catalytic base 22 was eliminated by sealing member 23.

The temperature inside the electric furnace 21 was set to 730° C., at which temperature carbon nanotubes were produced, while an argon gas was supplied to the space of the feedstock gas supplying side out of the spaces separated by sealing member 23. Thereafter, the supply of argon gas was stopped and, as the feedstock gas, an acetylene gas ($C_2H_2$) was flown into furnace tube 21 to attain 3 atmospheres. To the space of the carbon nanotube growth side out of the spaces separated by sealing member 23, an argon gas was flown as the carrier gas to attain 3 atmospheres. Thereafter, deformation of the catalytic base was monitored using laser light.

As a result, since deformation of the catalytic base due to precipitation of carbon in the catalytic base was observed on a monitor, the temperature was increased in order to reduce precipitation. Also, control such as reduction of the pressure was exerted. As a result, carbon nanotubes were produced in a stable manner.

Example 6

(1) Fabrication of Catalytic Base

An Fe (iron) pipe (Fe purity: 5N (99.999%)) with an outer diameter of 45 mm and an inner diameter of 35 mm was inserted into an Ag (silver) pipe with an outer diameter of 60 mm and an inner diameter of 45 mm, and an Ag rod with an outer diameter of 35 mm was inserted into the Fe pipe. The combined metal material underwent wiredrawing until it had an outer diameter of 2 mm to provide a wire 1. Wire 1 was cut into segments each with a length of 1 meter which were then bundled together, with which an Ag pipe with an outer diameter of 60 mm and an inner diameter of 40 mm was filled, with Ag spacers to eliminate clearance. The resulting material underwent wiredrawing until it had an outer diameter of about 2 mm with a drawing die to provide a wire 2. The step of producing wire 2 from wire 1 was repeated to ultimately provide an assembly that was made of a combined material of Ag base with Fe penetrating therethrough and that had a diameter of 20 mm. The assembly was made of a plurality of catalyst structures bundled together having Fe with an outer diameter of about 8 nm.

The assembly was cut into segments and their cross section surfaces at opposing ends (opposing end surfaces) were polished by means of buffing-polish or the like to have a thickness of about 40 μm. Thereafter, the assembly underwent heat treatment in a mixture gas of methane, hydrogen and argon at 850° C. Further, using cluster ion beam or the like, a non-crystal growth surface was planarized so that the catalytic material was exposed in a shape of a ring. Further, an Fe film was formed at a thickness of about 20 μm on the non-crystal growth surface. The end surface to be a crystal growth surface was polished with cluster ion beam and sputtering was conducted such that the catalytic base attains a thickness of about 40 μm, and the crystal growth surface was planarized so that the catalytic material was exposed in a shape of a ring. Thus, a catalytic base was produced.

(2) Manufacture of Carbon Nanostructures

The catalytic base obtained as above was used to manufacture carbon nanotubes as carbon nanostructures by applying plasma carburizing technique in supplying the feedstock gas. In the manufacture of carbon nanostructures, a manufacturing apparatus as shown in FIG. 6 was used. The manufacturing apparatus constituted by furnace tube 61, which was a heat and pressure resistant heat treatment furnace tube having an electric furnace that was a heating apparatus, a gas introduce/evacuate system, a growth temperature control system, a vacuum control system, a gas flowmeter, a plasma carburizing apparatus and the like, was divided by interposed catalytic base 64 to have a space of the non-crystal growth surface side and a space of the crystal growth surface side. In the space of the non-crystal growth side, an anode 65 was arranged. Catalytic material 62 was exposed to the non-crystal growth side and the crystal growth side. The temperature inside the manufacturing apparatus was set to 860° C., and a direct voltage was applied between anode 65 and catalytic base 64 serving as a cathode. Then a feedstock gas constituted by a mixture gas of propane gas, hydrogen gas and argon gas was supplied at about 7 torr (about $9.31 \times 10^2$ Pa) so that the current density of glow discharge of about 0.2 A/cm² was attained. By causing glow discharge between catalytic base 64 and anode 65, plasma was produced, and ionized carbon was supplied to the Fe film, which was the non-crystal growth surface of catalytic base 64. The space of the crystal growth surface side was filled with a carrier gas containing a hydrogen gas and an argon gas. After an iron oxide film of the crystal growth surface was reduced, the supply of hydrogen gas was stopped and the space was filled only with the argon gas to produce carbon nanostructures 66. In order to suppress deformation of the catalytic base, the gas pressure in the space of the crystal growth surface side was set to be substantially equal to the gas pressure in the space of the non-crystal growth surface side.

As a result, production of carbon fibers from the catalytic base surface of the crystal growth side was visually recognized. As catalytic base 64 was electrically charged due to the voltage application at glow discharge, the carbon fibers were electrically charged as well. Accordingly, this static electricity was utilized in attracting the carbon fibers toward a wrapping roll to be collected.

The catalytic base and the resulting carbon fibers were observed by scanning electron microscopy, and carbon nanotubes were recognized to be grown from the crystal growth surface of the catalytic material. Further, the carbon fibers were observed by transmission electron microscopy (TEM) and Raman spectroscopy, and the carbon fibers were recognized to be carbon nanotubes, and substantially no impurities such as amorphous carbon, graphite, catalytic material and the like were included.

Example 7

(1) Fabrication of Catalytic Base

An Fe (iron) rod (Fe purity: 5N (99.999%)) with an outer diameter of 45 mm was inserted into an Ag (silver) pipe with an outer diameter of 60 mm and an inner diameter of 45 mm. The combined material underwent wiredrawing until it had an outer diameter of 2 mm to provide a wire 1. Wire 1 was cut into segments each with a length of 1 meter which were then bundled together, with which an Ag pipe with an outer diameter of 60 mm and an inner diameter of 40 mm was filled, with Ag spacers to eliminate clearance. The resulting material underwent wiredrawing until it had an outer diameter of about 2 mm with a drawing die to provide a wire 2. The step of producing wire 2 from wire 1 was repeated to ultimately provide an assembly that was made of a combined material of Ag base with Fe penetrating therethrough and that had a diameter of 20 mm. The assembly was made of a plurality of catalyst structures bundled together having Fe with an outer diameter of about 0.5 nm.

The assembly was cut into segments and their cross section surfaces at opposing ends (opposing end surfaces) were polished by means of buffing-polish or the like to have a thickness of about 40 µm. Thereafter, the assembly underwent heat treatment in a mixture gas of methane, hydrogen and argon at 850° C. Further, using cluster ion beam or the like, a non-crystal growth surface was planarized so that the catalytic material was exposed in a shape of a ring. Further, an Fe film was formed at a thickness of about 20 µm on the non-crystal growth surface. The end surface to be a crystal growth surface was polished with cluster ion beam and sputtering was conducted such that the catalytic base attains a thickness of about 40 µm, and the crystal growth surface was planarized so that the catalytic material was exposed in a shape of a ring. Thus, a catalytic base was produced.

(2) Manufacture of Carbon Nanostructures

The catalytic base obtained as above was used to manufacture carbon nanotubes as carbon nanostructures by applying plasma carburizing technique in supplying the feedstock gas. In the manufacture of carbon nanostructures, a manufacturing apparatus as shown in FIG. 6 was used. The manufacturing apparatus constituted by furnace tube 61, which was a heat and pressure resistant heat treatment furnace tube having an electric furnace that was a heating apparatus, a gas introduce/evacuate system, a growth temperature control system, a vacuum control system, a gas flowmeter, a plasma carburizing apparatus and the like, was divided by interposed catalytic base 64 to have a space of the non-crystal growth surface side and a space of the crystal growth surface side. In the space of the non-crystal growth side, an anode 65 was arranged. Catalytic material 62 was exposed to the non-crystal growth side and the crystal growth side. The temperature inside the manufacturing apparatus was set to 860° C., and a direct voltage was applied between anode 65 and catalytic base 64 serving as a cathode. Then a feedstock gas constituted by a mixture gas of propane gas, hydrogen gas and argon gas was supplied at about 7 torr (about $9.31 \times 10^2$ Pa) so that the current density of glow discharge of about 0.2 A/cm$^2$ was attained. By causing glow discharge between catalytic base 64 and anode 65, plasma was produced, and ionized carbon was supplied to the Fe film, which was the non-crystal growth surface of catalytic base 64. The space of the crystal growth surface side was filled with a carrier gas containing a hydrogen gas and an argon gas. After an iron oxide film of the crystal growth surface was reduced, the supply of hydrogen gas was stopped and the space was filled only with the argon gas to produce carbon nanostructures 66. In order to suppress deformation of the catalytic base, the gas pressure in the space of the crystal growth surface side was set to be substantially equal to the gas pressure in the space of the non-crystal growth surface side.

As a result, production of carbon fibers from the catalytic base surface of the crystal growth side was visually recognized. As catalytic base 64 was electrically charged due to the voltage application at glow discharge, the carbon fibers were electrically charged as well. Accordingly, this static electricity was utilized in attracting the carbon fibers toward a wrapping roll to be collected.

The catalytic base and the resulting carbon fibers were observed by scanning electron microscopy, and carbon nanotubes were recognized to be grown from the crystal growth surface. Further, the carbon fibers were observed by transmission electron microscopy (TEM) and Raman spectroscopy, and the carbon fibers were recognized to be carbon nanotubes having a minimum diameter of about 0.4 nm, and substantially no impurities such as amorphous carbon, graphite, catalytic material and the like were included.

Comparative Example

Carbon nanotubes were produced through a method in which, in place of the catalytic structure of Example 1, a catalytic material including an alumina base carrying Fe fine particles of an average grain size of about 8 nm produced by pyrolysis of ferrocene was inserted into a furnace tube similar to the one in Example 1, and acetylene gas was flown without applying pressure. Through an observation of transmission electron microscopy (TEM) and Raman spectroscopy, while carbon nanotubes were produced, by-product such as amorphous carbon, graphite and the like were also produced in a large amount.

From the result above, in the Examples, it was found that a carbon dissolution portion resulted by pyrolysis of a feedstock gas and a carbon precipitation portion can be separated by using at least two gases constituted by a feedstock gas and a carrier gas, and by setting at least two conditions for bringing an ambient gas into contact with a catalytic base, whereby desired carbon nanotubes can be produced in high purity and efficiently, substantially without any by-product such as amorphous carbon, graphite or the like.

It should be understood that the disclosed embodiments and examples above are, in all respects, by way of illustration only and are not by way of limitation. The scope of the present invention is set forth by the claims rather than the above description and is intended to cover all the modifications within a spirit and scope equivalent to those of the claims.

INDUSTRIAL APPLICABILITY

According to the present invention, carbon nanostructures having a more uniform shape can be produced in high purity and in a stable manner.

The invention claimed is:

1. A method of manufacturing a carbon nanostructure using a furnace tube for growing crystalline carbon by means of vapor deposition from a crystal growth surface of a catalytic base including a catalytic material, said furnace tube being divided by said catalytic base into a feedstock gas supplying side and a carbon nanostructure growth side, the method comprising steps of:
supplying at least one carrier gas from said carbon nanostructure growth side to make said carrier gas brought into contact with said crystal growth surface; and
supplying at least one feedstock gas from said feedstock gas supplying side to make said feedstock gas brought into contact with the catalytic material on an upstream side of the catalytic base,
wherein said at least one feedstock gas is not brought into contact with said crystal growth surface,
wherein said at least one feedstock gas and said at least one carrier gas is supplied so that carbon is continuously supplied to said crystalline carbon through inside of said catalytic material.

2. The method of manufacturing a carbon nanostructure according to claim 1, wherein at least two conditions for bringing an ambient gas into contact with said catalytic base are set simultaneously, and said ambient gas is one gas or at least two gases including at least one feedstock gas.

3. The method of manufacturing a carbon nanostructure according to claim 1, wherein said at least two conditions for bringing into contact are simultaneously set by setting said at least one feedstock gas and said at least one carrier gas to be brought into contact with said catalytic base with at least two different pressures.

4. The method of manufacturing a carbon nanostructure according to claim 1, wherein at least one gas in said at least one feedstock gas and said at least one carrier gas is supplied so as to be brought into contact with said catalytic base with a pressure of at least atmospheric pressure.

5. The method of manufacturing a carbon nanostructure according to claim 1, wherein an area of said catalytic material in contact with said feedstock gas is greater than a surface area of said crystal growth surface of said catalytic material.

6. The method of manufacturing a carbon nanostructure according to claim 1, wherein a carrier gas is supplied so as to be converged at least at one portion after passing near said crystal growth surface.

7. The method of manufacturing a carbon nanostructure according to claim 1, wherein a carrier gas is supplied so as to form a vortex after passing near said crystal growth surface.

8. The method of manufacturing a carbon nanostructure according to claim 1, wherein a heat source is provided for changing a temperature near said crystal growth surface.

9. The method of manufacturing a carbon nanostructure according to claim 1, wherein a temperature stabilizing apparatus for attaining a constant temperature of a portion of said catalytic base in contact with said feedstock gas.

10. The method of manufacturing a carbon nanostructure according to claim 1, wherein mechanical polishing and/or sputtering is provided to said crystal growth surface.

11. The method of manufacturing a carbon nanostructure according to claim 1, wherein a reactivation process is provided to said crystal growth surface employing at least one selected from the group consisting of chemical polishing, physical polishing, and sputtering.

12. The method of manufacturing a carbon nanostructure according to claim 1, wherein said catalytic base is constituted by said catalytic material and a non-catalytic material without a substantial catalytic action to growth of said crystalline carbon.

13. The method of manufacturing a carbon nanostructure according to claim 12, wherein said catalytic material is exposed only in a portion of said crystal growth surface in contact with said feedstock gas.

14. The method of manufacturing a carbon nanostructure according to claim 12, wherein said catalytic material and said non-catalytic material do not substantially produce an alloy or a compound.

15. The method of manufacturing a carbon nanostructure according to claim 12, wherein said non-catalytic material includes at least one selected from the group consisting of Ag, Au, Ru, Rh, Pd, Os, Ir, and Pt.

16. The method of manufacturing a carbon nanostructure according to claim 12, wherein said catalytic material is constituted by at least one selected from the group consisting of Fe, Co, Mo, Ni, In, and Sn, and said non-catalytic material is constituted by Ag and/or Ag containing alloy.

17. The method of manufacturing a carbon nanostructure according to claim 12, wherein a reinforce material for suppressing deformation of said catalytic base is formed to at least a part of said catalytic base.

18. The method of manufacturing a carbon nanostructure according to claim 1, wherein at least one of selection of a gas, a gas pressure and a temperature is controlled so as to suppress precipitation of carbon inside said catalytic material of said catalytic base and/or at an interface between said catalytic material and a non-catalytic material.

19. The method of manufacturing a carbon nanostructure according to claim 1, wherein said at least one feedstock gas and said at least one carrier gas contains an ion.

20. The method of manufacturing a carbon nanostructure according to claim 19, wherein said ion includes a carbon ion, and said carbon ion is collided to said catalytic material by an electric field.

21. The method of manufacturing a carbon nanostructure according to claim 20, wherein a voltage is applied to said catalytic base, and said carbon ion is collided to said catalytic material by a potential difference.

* * * * *